(12) United States Patent
Lee et al.

(10) Patent No.: US 11,411,145 B2
(45) Date of Patent: Aug. 9, 2022

(54) LIGHT-EMITTING ELEMENT PACKAGE

(71) Applicant: SAMSUNG ELECTRONICS CO., LTD., Suwon-si (KR)

(72) Inventors: Jin Sub Lee, Suwon-si (KR); Ju Yeon Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/023,629

(22) Filed: Sep. 17, 2020

(65) Prior Publication Data

US 2021/0242374 A1 Aug. 5, 2021

(30) Foreign Application Priority Data

Jan. 30, 2020 (KR) .................. 10-2020-0011077

(51) Int. Cl.
| | |
|---|---|
| *H01L 33/50* | (2010.01) |
| *H01L 33/56* | (2010.01) |
| *H01L 33/32* | (2010.01) |
| *H01L 33/36* | (2010.01) |
| H01L 25/075 | (2006.01) |
| H01L 27/15 | (2006.01) |

(52) U.S. Cl.
CPC .......... *H01L 33/502* (2013.01); *H01L 33/507* (2013.01); *H01L 33/56* (2013.01); *H01L 25/0753* (2013.01); *H01L 27/153* (2013.01); *H01L 33/325* (2013.01); *H01L 33/36* (2013.01)

(58) Field of Classification Search
CPC ..... H01L 33/502; H01L 33/507; H01L 33/56; H01L 25/0753; H01L 27/153
See application file for complete search history.

(56) References Cited

U.S. PATENT DOCUMENTS

| | | | |
|---|---|---|---|
| 7,965,028 B2 | 6/2011 | Liu et al. | |
| 8,941,566 B2 | 1/2015 | Haase | |
| 9,099,619 B2 * | 8/2015 | Koizumi | ............... H01L 33/505 |
| 2019/0165040 A1 | 5/2019 | Dupont et al. | |

(Continued)

FOREIGN PATENT DOCUMENTS

| | | |
|---|---|---|
| KR | 10-1707970 B1 | 2/2017 |
| KR | 10-2018-0078940 A | 7/2018 |

*Primary Examiner* — Mark W Tornow
(74) *Attorney, Agent, or Firm* — Sughrue Mion, PLLC (57) ABSTRACT

A light-emitting element package is provided. The light-emitting element package includes light-emitting structures spaced from each other, the light-emitting structures including first, second and third light-emitting structures, each of the light-emitting structures being configured to emit light of a first color; a first wavelength conversion layer provided on the first light-emitting structure at a first position corresponding to the first light-emitting structure, the first wavelength conversion layer being configured to convert light of the first color into light of a second color; a first oxide film provided on the first wavelength conversion layer; and a second wavelength conversion layer disposed in the first oxide film at a second position corresponding to the second light-emitting structure, the second wavelength conversion layer being configured to convert light of the first color into light of a third color. The first wavelength conversion layer and the second wavelength conversion layer have different structures.

20 Claims, 10 Drawing Sheets

(56) References Cited

U.S. PATENT DOCUMENTS

| | | | |
|---|---|---|---|
| 2019/0355874 A1* | 11/2019 | Hemer | H01L 27/156 |
| 2019/0385513 A1* | 12/2019 | Iguchi | G09F 9/00 |
| 2021/0005794 A1 | 1/2021 | Sakong et al. | |

\* cited by examiner

LIGHT-EMITTING ELEMENT PACKAGE

CROSS-REFERENCE TO RELATED APPLICATION

This application claims priority from Korean Patent Application No. 10-2020-0011077 filed on Jan. 30, 2020 in the Korean Intellectual Property Office, the disclosure of which is incorporated herein by reference in its entirety.

BACKGROUND

1. Field

Methods and apparatuses consistent with example embodiments relate to a light-emitting element package, and more particularly, to a light-emitting element package with an improved light absorption rate and light conversion efficiency.

2. Related Art

A semiconductor light-emitting element has a long lifespan, low power consumption, fast response speed, environmental friendliness and other advantages. The semiconductor light-emitting element is used as a light source in various products such as a lighting device and a backlight of a display device. Accordingly, there is a continuous need for a light-emitting element package with improved light efficiency and reduced manufacturing cost.

Particularly, a light-emitting diode (LED) is a semiconductor light-emitting element that converts current into light. Since the commercialization of a red LED using a GaAsP compound semiconductor in 1962, the red LED and a GaP:N-based green LED have been used as light sources in electronic devices.

In a GaN-based material, a wavelength may be variously adjusted by the amount of indium (In). The GaN-based material not only has excellent properties as a semiconductor but also has high transparency. Accordingly, the GaN-based material is widely used in visible devices.

SUMMARY

One or more example embodiments provide a light-emitting element package with an improved light absorption rate and light conversion efficiency using a quantum well structure as a light conversion layer.

However, example embodiments are not restricted to the ones set forth herein. The above and other aspects of the present disclosure will become more apparent to one of ordinary skill in the art by referencing the detailed description below.

According to an aspect of an example embodiment, there is provided a light-emitting element package that includes a plurality of light-emitting structures spaced from each other in a first direction, the plurality of light-emitting structures including a first light-emitting structure, a second light-emitting structure and a third light-emitting structure, each of the plurality of light-emitting structures being configured to emit light of a first color;
a first wavelength conversion layer provided on the first light-emitting structure at a first position corresponding to the first light-emitting structure, the first wavelength conversion layer being configured to convert light of the first color into light of a second color;
a first oxide film provided on the first wavelength conversion layer; and
a second wavelength conversion layer disposed in the first oxide film at a second position corresponding to the second light-emitting structure, the second wavelength conversion layer being configured to convert light of the first color into light of a third color,
wherein the first wavelength conversion layer and the second wavelength conversion layer have different structures.

According to an aspect of an example embodiment, there is provided a light-emitting element package that includes a plurality of light-emitting structures spaced from each other in a first direction, the plurality of light-emitting structures including a first light-emitting structure, a second light-emitting structure and a third light-emitting structure, each of the plurality of light-emitting structures being configured to emit light of a first color; and a light conversion layer disposed on the plurality of light-emitting structures, the light conversion layer including a first wavelength conversion layer disposed at a first location corresponding to the first light-emitting structure and a second wavelength conversion layer disposed at a second location corresponding to the second light-emitting structure, wherein the first wavelength conversion layer includes a quantum dot and is configured to convert light of the first color into light of a second color, and wherein the second wavelength conversion layer includes a quantum well and is configured to convert light of the first color into light of a third color.

According to an aspect of an example embodiment, there is provided a light-emitting element package that includes a plurality of electrodes disposed in a first oxide film; a plurality of light-emitting structures disposed on the first oxide film, the plurality of light-emitting structures being spaced from each other in a first direction, emitting light of a first color, and including a first light-emitting structure, a second light-emitting structure and a third light-emitting structure; a first light conversion layer disposed on the plurality of light-emitting structures, the first light conversion layer including a quantum dot at a first position corresponding to the first light-emitting structure and partition walls; and a second light conversion layer disposed on the first light conversion layer, the second light conversion layer including a second oxide film and a quantum well at a second position corresponding to the second light-emitting structure, wherein the quantum dot is configured to convert light of the first color into light of a second color, wherein the quantum well is configured to convert light of the first color into light of a third color, wherein the quantum dot is interposed between two of the partition walls, and wherein the quantum dot and the quantum well do not overlap each other in a second direction that crosses the first direction.

BRIEF DESCRIPTION OF THE DRAWINGS

The above and other aspects and features will be more clearly understood from the following detailed description, taken in conjunction with the attached drawings, in which.

DETAILED DESCRIPTION

Figure 1:
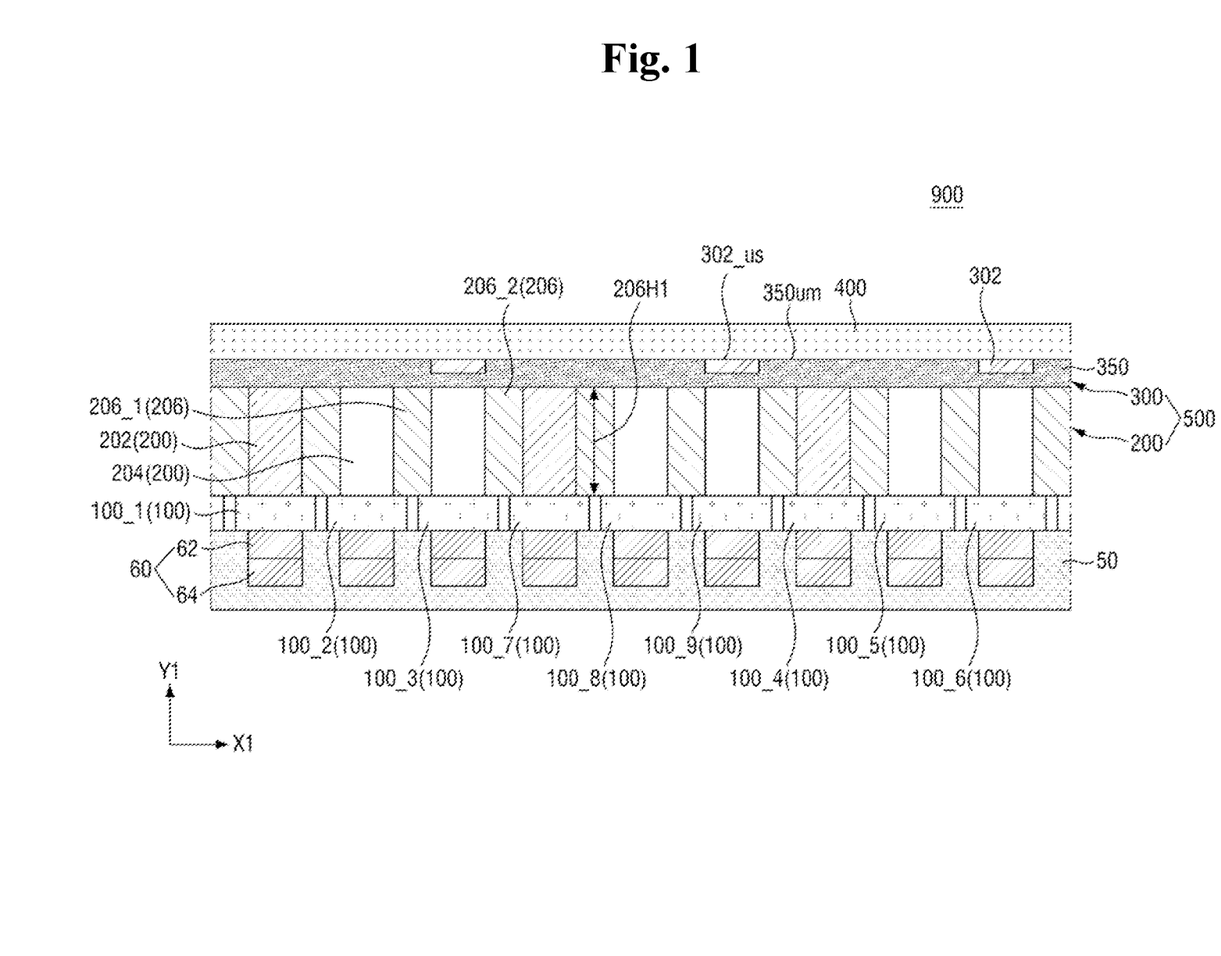
FIG. 1 is a cross-sectional view showing a light-emitting element package according to some example embodiments.

FIG. 1 is a cross-sectional view showing a light-emitting element package according to some example embodiments.

Referring to FIG. 1, a light-emitting element package 900 may include electrode layers 60, complex light-emitting structures 100, a buffer layer 400, and a light conversion layer 500.

In some example embodiments, each electrode layer 60 may include a first electrode layer 62 and a second electrode layer 64. Further, the electrode layers 60 may include a plurality of electrode layers spaced apart from each other in a first direction X1. The first electrode layer 62 may be disposed on and in contact with the second electrode layer 64. Specifically, a top surface of the second electrode layer 64 may directly contact a bottom surface of the first electrode layer 62.

In some example embodiments, the first electrode layer 62 and the second electrode layer 64 may be arranged in a second direction Y1. The second direction Y1 may be a direction crossing the first direction X1. In some example embodiments, the angle formed between the first direction X1 and the second direction Y1 may be a right angle. However, example embodiments are not limited thereto.

The first electrode layer 62 may be directly connected to the second electrode layer 64. The term "direct connection" as used herein means that no member is disposed between the first electrode layer 62 and the second electrode layer 64. Specifically, the first electrode layer 62 and the second electrode layer 64 may be electrically connected to each other.

The electrode layers 60 may function to apply power to the light-emitting element package 900.

The electrode layer 60 may include a conductive material such as Ag, Ni, Al, Rh, Pd, Ir, Ru, Mg, Zn, Pt, Au or the like. In some example embodiments, the electrode layer 60 may include a structure of two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt or the like. In some example embodiments, the electrode layer 60 may include a seed layer formed of a metal material such as Ni, Cr or the like, and an electrode material layer formed of a metal material such as Au or the like through a plating process using the seed layer as a seed. However, example embodiments are not limited thereto.

In some example embodiments, the first electrode layer 62 may include at least one of Al, Au, Cr, Ni, Ti or Sn, and the second electrode layer 64 may be formed of a reflective metal. In this case, the first electrode layer 62 and the second electrode layer 64 may be formed in separate processes.

As illustrated in FIG. 1, the width of the first electrode layer 62 may be the same as that of the second electrode layer 64 in the first direction X1, but example embodiments are not limited thereto. The width of the first electrode layer 62 may be different from that of the second electrode layer 64 in the first direction X1. For example, the width of the first electrode layer 62 may be greater than that of the second electrode layer 64, or the width of the first electrode layer 62 may be smaller than that of the second electrode layer 64.

A first oxide film 50 may fill spaces between the electrode layers 60 which are spaced apart from each other in the first direction X1. That is, the first oxide film 50 may cover sidewalls of the electrode layers 60. Specifically, the first oxide film 50 may cover both sidewalls of the first electrode layer 62. The first oxide film 50 may cover both sidewalls of the second electrode layer 64. In some example embodiments, the first oxide film 50 may cover a bottom surface of the second electrode layer 64.

In some example embodiments, an upper portion and a lower portion of the first oxide film 50 may be bonded by a direct bonding method. According to some example embodiments, the upper portion of the first oxide film 50 may be integrally formed with the first electrode layer 62. Further, the lower portion of the first oxide film 50 may be integrally formed with the second electrode layer 64. The formed first electrode layer 62 and upper portion of the first oxide film 50, and the formed second electrode layer 64 and lower portion of the first oxide film 50 may be combined by the direct bonding method.

Specifically, the first electrode layer 62 may be combined with the second electrode layer 64, and the upper portion of the first oxide film 50 may be combined with the lower portion of the first oxide film 50, by using the direct bonding method.

In some example embodiments, the electrode layers 60 may be disposed in the first oxide film 50. That is, the first oxide film 50 may include the electrode layers 60. Specifically, a top surface of the first oxide film 50 may be coplanar with a top surface of the first electrode layer 62. In the present disclosure, the meaning of "coplanar" includes a minute difference due to a process margin.

The first oxide film 50 may include an oxide such as $SiO_2$, SiN, $SiO_xN_y$, $TiO_2$, $Al_2O_3$, $ZrO_2$ or the like, but example embodiments are not limited thereto.

In some example embodiments, the complex light-emitting structures 100 may include first to ninth light-emitting structures 100_1 to 100_9 spaced apart from each other in the first direction X1. The first to ninth light-emitting structures 100_1 to 100_9 may be structures that are spaced apart from each other in the first direction X1 and may be electrically isolated from each other.

Although nine complex light-emitting structures 100 are illustrated, example embodiments are not limited thereto. The number of the complex light-emitting structures 100 may be greater or less than nine.

The first to ninth light-emitting structures 100_1 to 100_9 may be disposed on the first oxide film 50. The first to ninth light-emitting structures 100_1 to 100_9 may be disposed on the electrode layers 60. Specifically, the first to ninth light-emitting structures 100_1 to 100_9 may be electrically connected to the electrode layers 60 spaced apart from each other in the first direction X1.

Power may be applied to the first to ninth light-emitting structures 100_1 to 100_9 through the electrode layers 60.

In some example embodiments, the first to ninth light-emitting structures 100_1 to 100_9 may be structures that emit light of a first color. For example, the first to ninth light-emitting structures 100_1 to 100_9 may be structures that emit blue light. For convenience of explanation, in the following description, it is assumed that the first to ninth light-emitting structures 100_1 to 100_9 emit blue light. However, example embodiments are not limited thereto.

For example, through the light conversion layer 500 to be described later, the first to third light-emitting structures 100_1, 100_2, and 100_3 may implement red, green and blue (RGB) colors. Similarly, the light conversion layer 500 may allow fourth to sixth light-emitting structures 100_4, 100_5, and 100_6 to implement RGB colors, and the seventh to ninth light-emitting structures 100_7, 100_8, and 100_9 to implement RGB colors.

The first to ninth light-emitting structures 100_1 to 100_9 may include, e.g., GaN/InGaN or GaN/AlGaN. In some example embodiments, because the first to ninth light-emitting structures 100_1 to 100_9 include indium (In) atoms, band gap energy of the first to ninth light-emitting structures 100_1 to 100_9 may be smaller than that of a compound semiconductor containing only GaN.

The light conversion layer 500 may include a first light conversion layer 200 and a second light conversion layer 300.

The first light conversion layer 200 may be disposed on the complex light-emitting structures 100. The first light conversion layer 200 may include first wavelength conversion layers 202, first transmission layers 204, and partition walls 206.

The first wavelength conversion layers 202 may be spaced apart from each other in the first direction X1. As shown in FIG. 1, one of the first wavelength conversion layers 202 may be disposed on and directly connected to the first light-emitting structure 100_1. Further, one of the first wavelength conversion layers 202 may be disposed on and directly connected to the fourth light-emitting structure 100_4. Further, one of the first wavelength conversion layers 202 may be disposed on and directly connected to the seventh light-emitting structure 100_7. The term "directly connected" as used herein means that no member is interposed between two objects.

The first wavelength conversion layers 202 may convert light of the first color emitted from the first light-emitting structure 100_1, the fourth light-emitting structure 100_4 and the seventh light-emitting structure 100_7 into light of a second color. For example, the first color may be blue and the second color may be red. That is, the first wavelength conversion layers 202 may convert blue light emitted from the first light-emitting structure 100_1, the fourth light-emitting structure 100_4 and the seventh light-emitting structure 100_7 into red light.

In some example embodiments, a wavelength of light representing the first color may be increased to a wavelength of light representing the second color through the first wavelength conversion layers 202. That is, the wavelength of light representing the second color may be a wavelength longer than the wavelength of light representing the first color. This is based on the energy law. In other words, this is because the first wavelength conversion layer 202 may not emit light having energy greater than that of light emitted from the first light-emitting structure 100_1, the fourth light-emitting structure 100_4, and the seventh light-emitting structure 100_7.

For example, the first wavelength conversion layer 202 may include a quantum dot structure. In some example embodiments, quantum dots have diameters of about 1 to 10 nm. Various types of quantum dots may be used. For example, the quantum dot structure may include group II-VI quantum dots such as ZnS, ZnSe, ZnTe, CdS, CdSe, CdTe, HgS, HgSe, or HgTe, group III-V quantum dots such as PbS, PbSe, PbTe, AlN, AlP, AlAs, AlSb, GaN, GaAs, GaSb, InN, InP, InAs, or InSb, or the like. In some example embodiments, the quantum dot structure may have a core-shell structure. For convenience of explanation, in the following description, the first wavelength conversion layer 202 is assumed as a quantum dot structure to convert light of blue series into light of red series.

The first transmission layer 204 may be spaced apart from the first wavelength conversion layer 202 in the first direction X1. As illustrated in FIG. 1, the first transmission layers 204 may be directly connected to the second and third light-emitting structures 100_2 and 100_3, the fifth and sixth light-emitting structures 100_5 and 100_6, and the eighth and ninth light-emitting structures 100_8 and 100_9.

In some example embodiments, the first transmission layers 204 may cover, for example, portions of top surfaces of the second and third light-emitting structures 100_2 and 100_3, portions of top surfaces of the fifth and sixth light-emitting structures 100_5 and 100_6, and portions of top surfaces of the eighth and ninth light-emitting structures 100_8 and 100_9. However, example embodiments are not limited thereto, and the first transmission layers 204 may cover the entire top surfaces of the second and third light-emitting structures 100_2 and 100_3, and the entire top surfaces of the fifth and sixth light-emitting structures 100_5 and 100_6, and the entire top surfaces of the eighth and ninth light-emitting structures 100_8 and 100_9.

The first transmission layer 204 may include a light transmissive material, e.g., a transparent organic material such as an epoxy resin, a silicone resin, an epoxy-silicon hybrid, or the like. The light transmissive material may be cured by heating, light irradiation, time lapse, or the like. The silicone resin is classified into polydimethylsiloxane as a methyl-based silicone and polymethylphenylsiloxane as a phenyl-based silicone, which have a difference in refractive index, moisture permeability, light transmittance, light stability, and thermal stability.

The partition walls 206 may be disposed at both sides of the first wavelength conversion layer 202 and at both sides of the first transmission layer 204. The partition walls 206 may include first partition walls 206_1 and second partition walls 206_2. Specifically, the first partition walls 206_1 may correspond to the partition walls disposed at both sides of the first transmission layer 204. The second partition walls 206_2 may correspond to the partition walls disposed at both sides of the first wavelength conversion layer 202.

In other words, the partition walls 206 may overlap the first wavelength conversion layer 202 and the first transmission layer 204 in the first direction X1. The term "overlap" as used herein means that two objects superpose each other without necessarily being in direct contact with each other.

In some example embodiments, a portion of the partition wall 206 may overlap a portion of the complex light-emitting structure 100 in the second direction Y1. A portion of the partition wall 206 may overlap a portion of the first oxide film 50 in the second direction Y1. Further, a portion of the partition wall 206 may overlap the electrode layer 60 in the second direction Y1.

In some example embodiments, the first partition wall 206_1 may include a portion directly connected to the second partition wall 206_2. Specifically, the portion where the first partition wall 206_1 and the second partition wall 206_2 are directly connected may be disposed between the first wavelength conversion layer 202 and the first transmission layer 204.

Further, the first and second partition walls 206_1 and 206_2 may overlap each other in the first direction X1.

The partition walls 206 may function to prevent mixture of colors between the wavelength conversion layers. Specifically, the partition wall 206 may be formed of a material having significantly low light transmittance. Because a constituent material of the partition wall 206 includes the material having the significantly low light transmittance, light generated from any one of a plurality of cells may be blocked by the partition wall 206 not to leak to adjacent cells.

In some example embodiments, the first and second partition walls 206_1 and 206_2 may be integrally formed.

Further, the first and second partition walls 206_1 and 206_2 may be formed through a metal deposition process.

In some example embodiments, a first height 206H1 of the partition wall 206 may be substantially the same as the height of the first wavelength conversion layer 202. The first height 206H1 of the partition wall 206 may be substantially the same as the height of the first transmission layer 204. In the present disclosure, the meaning of "the same" includes a minute difference due to a process margin.

As the resolution of a display panel becomes higher, the size of pixels becomes smaller. In response to this trend, when the first height 206H1 of the partition wall 206 is also decreased, lights emitted from sub-pixels interfere with each other, and thus, there is a limit in decreasing the first height 206H1 of the partition wall structure.

Considering the manufacturing process according to some example embodiments, a partition wall on which a metal material is deposited may be used as the partition wall 206. By introducing a second wavelength conversion layer 302, which will be described later, the first height 206H1 of the partition wall 206 may be further decreased, thereby improving light extraction efficiency of a light-emitting diode. However, example embodiments are not limited thereto.

In some example embodiments, the partition wall 206 may include metal or a structure deposited with metal having low light transmittance. In some example embodiments, the partition wall 206 may include a black or a white insulator. For example, the color of the insulator may be selected according to the purpose of a display device. When the partition wall of the white insulator is used, reflectivity may be improved, and when the partition wall of the black insulator is used, contrast may be increased while providing the reflectivity.

The second light conversion layer 300 may be disposed on the first light conversion layer 200. That is, the second light conversion layer 300 may be disposed on the first wavelength conversion layers 202, the first transmission layers 204, and the partition walls 206.

The second light conversion layer 300 may include a second oxide film 350 and the second wavelength conversion layers 302. The second wavelength conversion layers 302 may be disposed in the second oxide film 350. Specifically, the second wavelength conversion layers 302 may be disposed at upper portions of the second oxide film 350.

Top surfaces 302_us of the second wavelength conversion layers 302 may be substantially coplanar with a topmost surface 350um of the second oxide film 350. In the present disclosure, the meaning of "substantially coplanar" includes a minute difference that may occur through the process. The reason why the top surfaces 302_us of the second wavelength conversion layers 302 are substantially coplanar with the topmost surface 350um of the second oxide film 350 will be described later in detail with reference to FIG. 6.

One of the second wavelength conversion layers 302 may overlap the third light-emitting structure 100_3 in the second direction Y1. One of the second wavelength conversion layers 302 may overlap the sixth light-emitting structure 100_6 in the second direction Y1. Further, one of the second wavelength conversion layers 302 may overlap the ninth light-emitting structure 100_9 in the second direction Y1.

Further, the second wavelength conversion layers 302 may not overlap the first and second light-emitting structures 100_1 and 100_2, the fourth and fifth light-emitting structures 100_4 and 100_5, and the seventh and eighth light-emitting structures 100_7 and 100_8, in the second direction Y1.

Moreover, the second wavelength conversion layers 302 may not overlap the first wavelength conversion layers 202 in the second direction Y1. The second wavelength conversion layers 302 may not overlap the first wavelength conversion layers 202 in the first direction X1, because the second wavelength conversion layers 302 are formed in the second oxide film 350 on the first light conversion layer 200.

Light of the first color emitted from the third light-emitting structure 100_3 may pass through the first transmission layer 204 and be converted into a third color through the second wavelength conversion layer 302. For example, the first color may be blue and the third color may be green. For convenience of explanation, in the following description, it is assumed that the third color is green.

Moreover, light of the first color emitted from the sixth light-emitting structure 100_6 may pass through the first transmission layer 204 and be converted into the third color through the second wavelength conversion layer 302. Further, light of the first color emitted from the ninth light-emitting structure 100_9 may pass through the first transmission layer 204 and be converted into the third color through the second wavelength conversion layer 302.

In some example embodiments, the second wavelength conversion layer 302 may have a different structure from the first wavelength conversion layer 202. In some example embodiments, in a wavelength range of blue-series light, the second wavelength conversion layer 302 may have an absorption coefficient of two to three times (or more) than that of the first wavelength conversion layer 202. For example, the second wavelength conversion layer 302 may have the absorption coefficient of two to three times (or more) than that of the first wavelength conversion layer 202 in the wavelength range of 455 nm to 492 nm of blue-series light. However, example embodiments are not limited thereto.

For example, the second wavelength conversion layer 302 may have a quantum well structure. In some example embodiments, the quantum well may include a material of InGaN/GaN or AlGaN/GaN. The quantum well structure is advantageous in terms of light conversion efficiency and light absorption rate, and therefore may provide a relatively high luminance.

In some example embodiments, the second wavelength conversion layer 302 may have a multi-quantum well (MQW) structure. Specifically, the multi-quantum well structure may be used for quantum-mechanically increasing coupling efficiency of electrons and holes. The quantum well structure may be a well structure in which a thin light-emitting layer and an insulating layer are alternately stacked. The light-emitting layer may be very thin as an active layer, and the insulating layer may serve as a barrier.

The quantum well structure may improve reliability in terms of heat or flux density. Further, the quantum well structure may improve reliability due to high light conversion efficiency and also have a heat dissipation effect even when the pixel size becomes smaller than a predetermined value.

The buffer layer 400 may be disposed on the second light conversion layer 300. The second light conversion layer 300 may be disposed between the buffer layer 400 and the first light conversion layer 200. The buffer layer 400 may extend in the first direction X1. The buffer layer 400 may act as a buffer to control a stress on the second wavelength conversion layer 302 during a growth process of the second wavelength conversion layer 302.

For example, the buffer layer 400 may include a GaN-based material, but example embodiments are not limited thereto.

Figure 2:
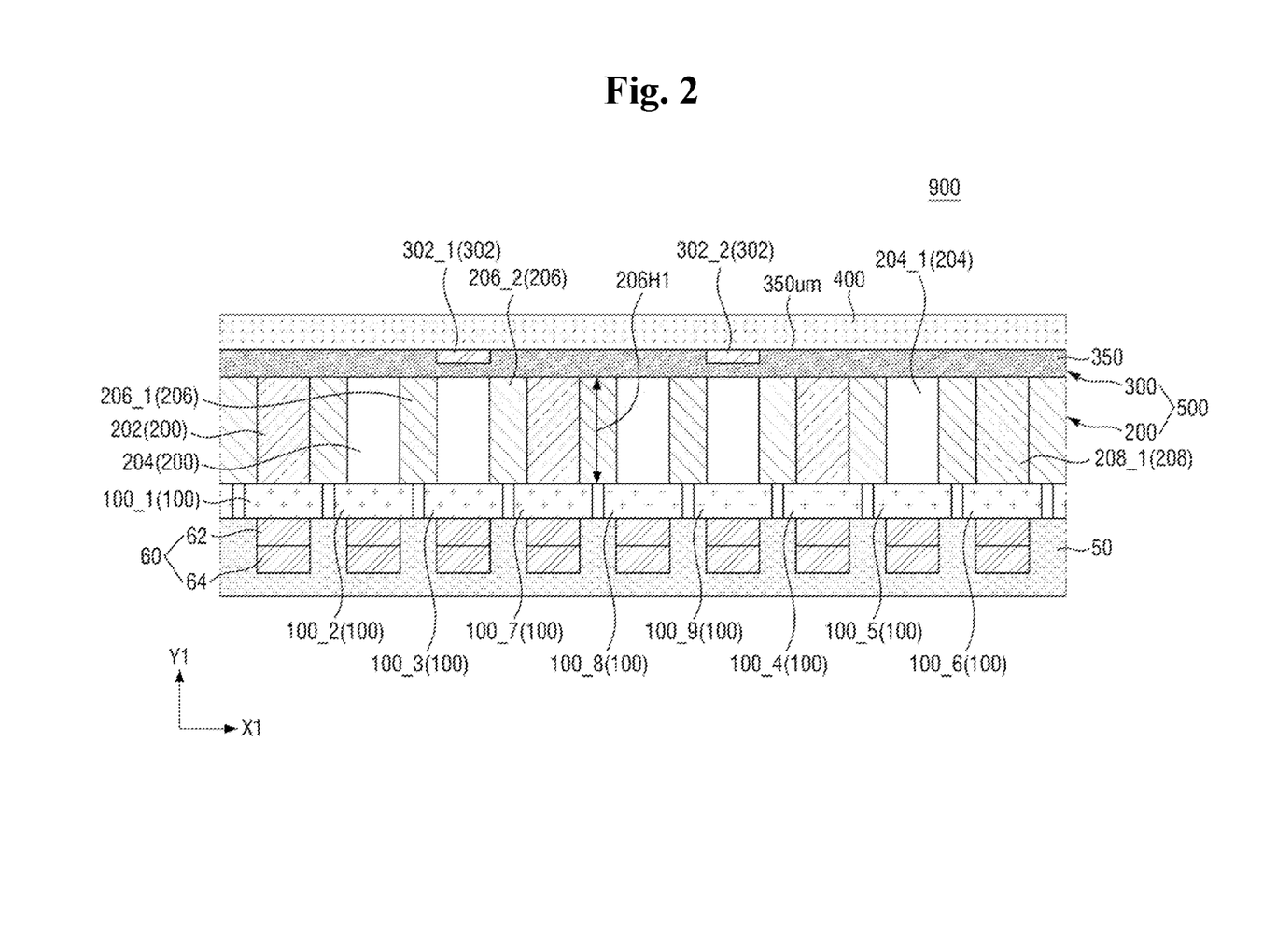
FIG. 2 is a cross-sectional view showing a light-emitting element package according to some example embodiments.

FIG. 2 is a cross-sectional view showing a light-emitting element package according to some example embodiments. For simplicity of description, a description overlapping with the description with reference to FIG. 1 will be briefly given or omitted.

Referring to FIG. 2, in some example embodiments, the light-emitting element package 900 may include a third wavelength conversion layer 208 for converting light of first color series emitted from the sixth light-emitting structure 100_6 into light of third color series. The third wavelength conversion layer 208 may include a third_first wavelength conversion layer 208_1 which is disposed on and directly connected to the sixth light-emitting structure 100_6.

Specifically, the third_first wavelength conversion layer 208_1 may be spaced apart from a first_first transmission layer 204_1, and the partition wall 206 may be interposed between the third_first wavelength conversion layer 208_1 and the first_first transmission layer 204_1. The third_first wavelength conversion layer 208_1 may overlap the first_first transmission layer 204_1 in the first direction X1. The third_first wavelength conversion layer 208_1 may overlap the first wavelength conversion layers 202 in the first direction X1.

For example, the third_first wavelength conversion layer 208_1 may convert light of the first color series emitted from the sixth light-emitting structure 100_6 into light of the third color series. For example, the first color may be blue and the third color may be green. Specifically, the third_first wavelength conversion layer 208_1 may convert blue light emitted from the sixth light-emitting structure 100_6 into green light.

In some example embodiments, the third_first wavelength conversion layer 208_1 may have the quantum dot structure. Light emitted from the third light-emitting structure 100_3 may pass through the first transmission layer 204 to reach a second_first wavelength conversion layer 302_1. Light emitted from the ninth light-emitting structure 100_9 may pass through the first transmission layer 204 to reach a second_second wavelength conversion layer 302_2. For example, the second_first wavelength conversion layer 302_1 and the second_second wavelength conversion layer 302_2 may have the quantum well structures.

Further, the second_first wavelength conversion layer 302_1 may overlap the second_second wavelength conversion layer 302_2 in the first direction X1.

In some example embodiments, the diameters of the quantum dots of the third_first wavelength conversion layer 208_1 may be different from those of the quantum dots of the first wavelength conversion layer 202. Specifically, when the quantum dots have relatively small diameters, the wavelength of the emitted light may be shortened, whereas when the quantum dots have relatively large diameters, the wavelength of the emitted light may be lengthened. Therefore, the diameters of the quantum dots of the first wavelength conversion layer 202 may be larger than those of the quantum dots of the third_first wavelength conversion layer 208_1.

In some example embodiments, the third_first wavelength conversion layer 208_1 and the first wavelength conversion layer 202 may be formed in separate processes.

Figure 3:
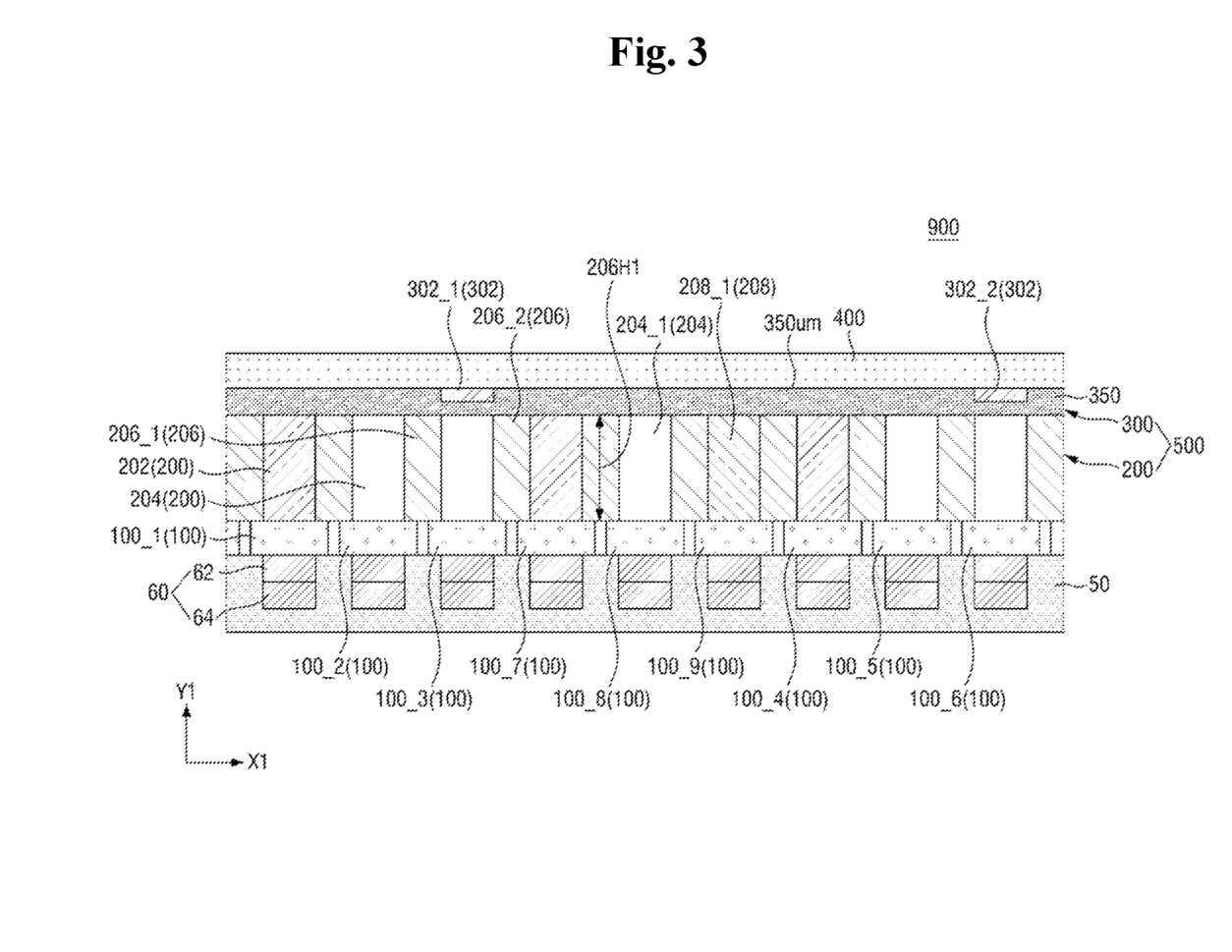
FIG. 3 is a cross-sectional view showing a light-emitting element package according to some example embodiments.

FIG. 3 is a cross-sectional view showing a light-emitting element package according to some example embodiments. For simplicity of description, a description overlapping with the description with reference to FIGS. 1 and 2 will be briefly given or omitted.

Referring to FIG. 3, in some example embodiments, the light-emitting element package 900 may include the third wavelength conversion layer 208 for converting light emitted from the ninth light-emitting structure 100_9. The third wavelength conversion layer 208 may include the third_first wavelength conversion layer 208_1 which is disposed on and directly connected to the ninth light-emitting structure 100_9.

In some example embodiments, the third_first wavelength conversion layer 208_1 may be disposed between the second oxide film 350 and the ninth light-emitting structure 100_9. Specifically, the third_first wavelength conversion layer 208_1 may be spaced apart from the first_first transmission layer 204_1, and the partition wall 206 may be interposed between the third_first wavelength conversion layer 208_1 and the first_first transmission layer 204_1. The third_first wavelength conversion layer 208_1 may be spaced apart from the first wavelength conversion layer 202, and the partition wall 206 may be interposed between the third_first wavelength conversion layer 208_1 and the first wavelength conversion layer 202. The third_first wavelength conversion layer 208_1 may overlap the first transmission layers 204 in the first direction X1. The third_first wavelength conversion layer 208_1 may overlap the first wavelength conversion layers 202 in the first direction X1.

For example, the third_first wavelength conversion layer 208_1 may convert light of the first color emitted from the ninth light-emitting structure 100_9 into light of the third color. For example, the first color may be blue and the third color may be green. Specifically, the third_first wavelength conversion layer 208_1 may convert blue light emitted from the ninth light-emitting structure 100_9 into green light.

Figure 4:
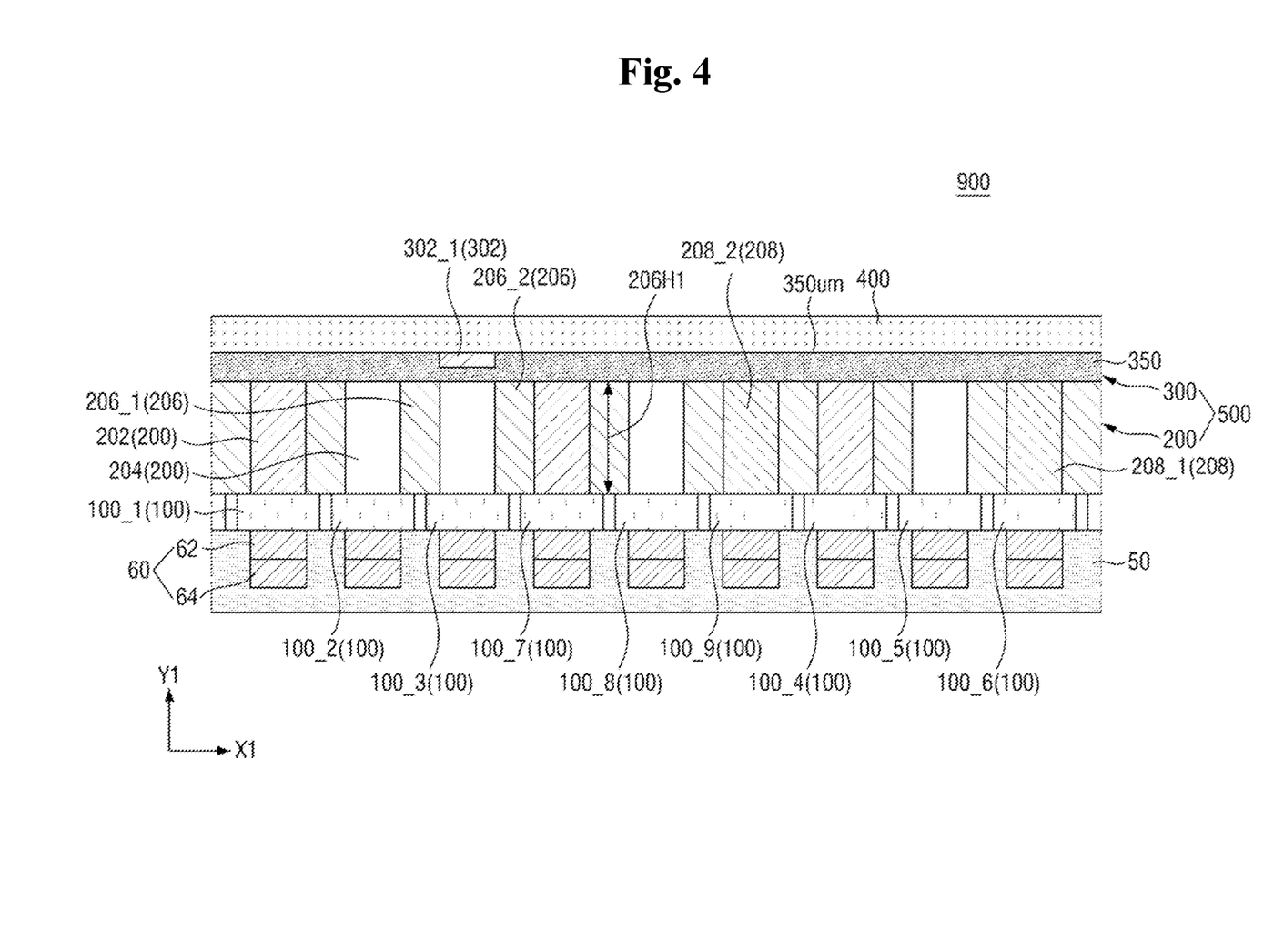
FIG. 4 is a cross-sectional view showing a light-emitting element package according to some example embodiments.

FIG. 4 is a cross-sectional view showing a light-emitting element package according to some example embodiments. For simplicity of description, a description overlapping with the description with reference to FIGS. 1 to 3 will be briefly given or omitted.

Referring to FIG. 4, the light-emitting element package 900 may include the third_first wavelength conversion layer 208_1 and a third_second wavelength conversion layer 208_2. The third_first wavelength conversion layer 208_1 converts blue-series light emitted from the sixth light-emitting structure 100_6 into green-series light. The third_second wavelength conversion layer 208_2 converts blue-series light emitted from the ninth light-emitting structure 100_9 into green-series light.

In some example embodiments, the third_first wavelength conversion layer 208_1 and the third_second wavelength conversion layer 208_2 may have the quantum dot structures. Meanwhile, the second_first wavelength conversion layer 302_1 may have the quantum well structure. The second_first wavelength conversion layer 302_1 may convert blue-series light emitted from the third light-emitting structure 100_3 into green-series light.

FIGS. 5 to 10 are cross-sectional views illustrating a method of manufacturing a light-emitting element package according to some example embodiments. For simplicity of description, a description overlapping with the description with reference to FIGS. 1 to 4 will be briefly given or omitted.

Figure 5:
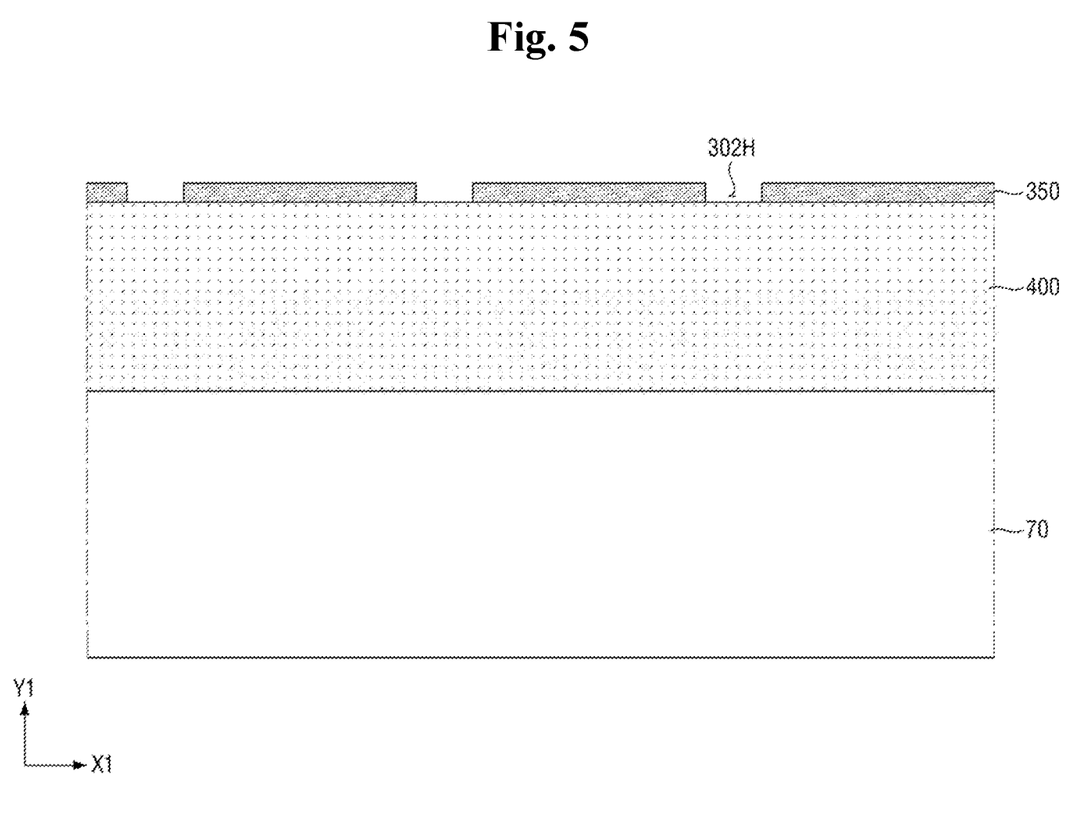
FIGS. 5 to 10 are cross-sectional views illustrating a method of manufacturing a light-emitting element package according to some example embodiments.

Referring to FIG. 5, the buffer layer 400 may be formed on a substrate 70, and the second oxide film 350 may be formed on the buffer layer 400. Further, second wavelength conversion layer holes 302H may be formed in the second oxide film 350 through a photolithography. Although FIG. 5 illustrates that the number of the second wavelength conversion layer holes 302H is three, example embodiments are not limited thereto, and the number of the second wavelength conversion layer holes 302H may be less or more than three.

In some example embodiments, the substrate 70 may be formed of a carrier wafer, a material suitable for semiconductor material growth. The substrate 70 may be formed of a material having high thermal conductivity. The substrate 70 may include a silicon-based substrate structure or an insulating substrate structure. The silicon-based substrate structure may include a silicon substrate or a silicon carbide substrate. The insulating substrate structure may include an insulating substrate such as sapphire, $MgAl_2O_4$, MgO, $LiAlO_2$, $LiGaO_2$, GaN, AlN, or the like. However, example embodiments are not limited thereto. For convenience of explanation, in the following description, the substrate 70 is assumed as the silicon substrate.

According to some example embodiments, the buffer layer 400 may be deposited on the substrate 70 by using a plasma enhanced chemical vapor deposition (PECVD) process.

In some example embodiments, the thickness of the buffer layer 400 may be 5 μm.

The second oxide film 350 may be deposited on the buffer layer 400. Specifically, the PECVD process may be used for the deposition.

Figure 6:
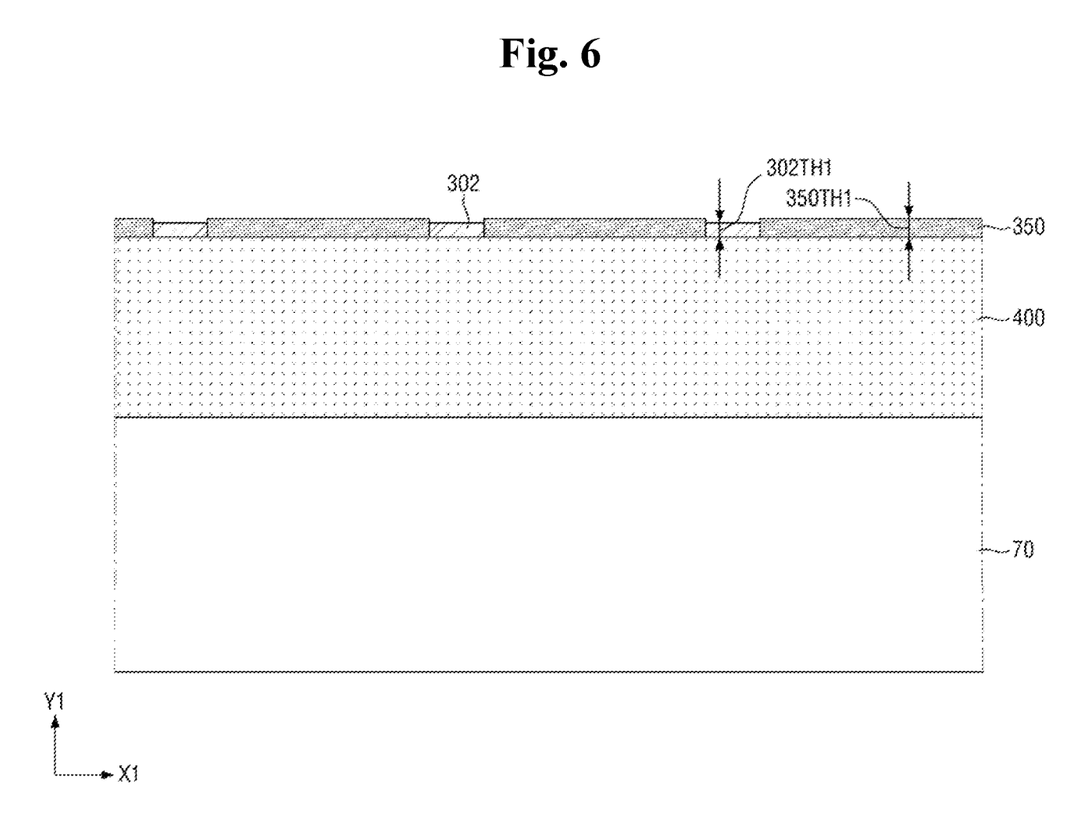

Referring to FIG. 6, the second wavelength conversion layers 302 may be filled in the second wavelength conversion layer holes 302H. The second wavelength conversion layers 302 may be, for example, the quantum well structures. According to some example embodiments, the second wavelength conversion layers 302 may be formed on a top surface of the buffer layer 400 through a metal organic chemical vapor deposition (MOCVD) process.

The MOCVD process is a chemical vapor deposition method in which a source gas flows onto a high temperature substrate to cause a decomposition reaction on the surface of the substrate to form a thin film, and the MOCVD process uses a source gas including an organometallic complex.

Specifically, the second wavelength conversion layer 302 may grow at a temperature of 800° C. to 1000° C. in the MOCVD process. In some example embodiments, a first thickness 350TH1 of the second oxide film 350 may be in a range of 0.5 μm to 2 μm. Meanwhile, when the first thickness 350TH1 of the second oxide film 350 is 2 μm, a second thickness 302TH1 of the second wavelength conversion layer 302 may be 2 μm or less. When the first thickness 350TH1 of the second oxide film 350 is 0.5 μm or less, the second thickness 302TH1 of the second wavelength conversion layer 302 may be 0.5 μm or less.

In some example embodiments, the first thickness 350TH1 of the second oxide film 350 may be equal to the second thickness 302TH1 of the second wavelength conversion layer 302. However, example embodiments are not limited thereto.

Figure 7:
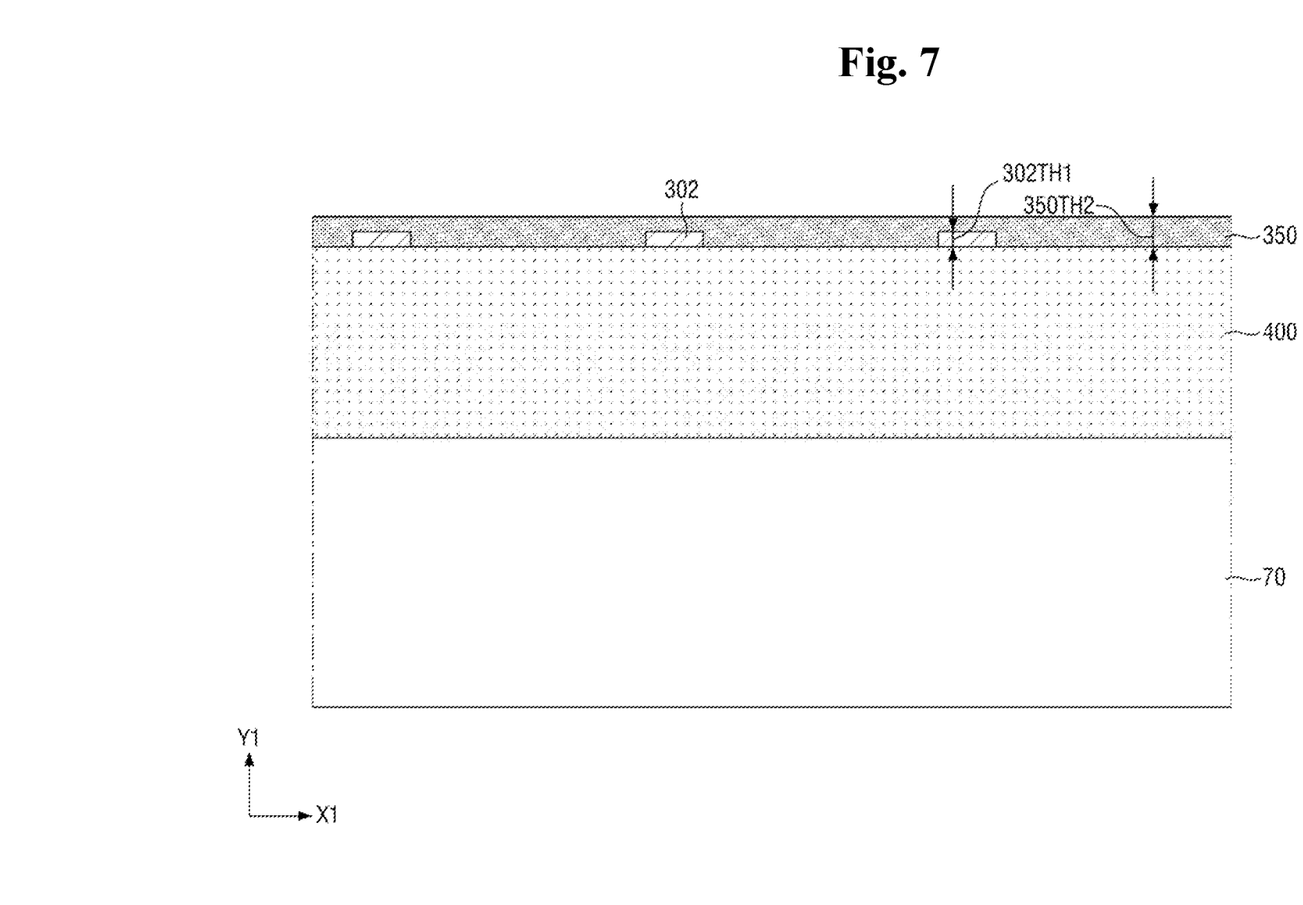

Referring to FIG. 7, the PECVD process may be used for the deposition of the second oxide film 350. After the second oxide film 350 is deposited, a polishing process may be performed. In some example embodiments, a chemical mechanical polishing (CMP) may be performed until a third thickness 350TH2 of the second oxide film 350 becomes 0.8 μm.

Figure 8:
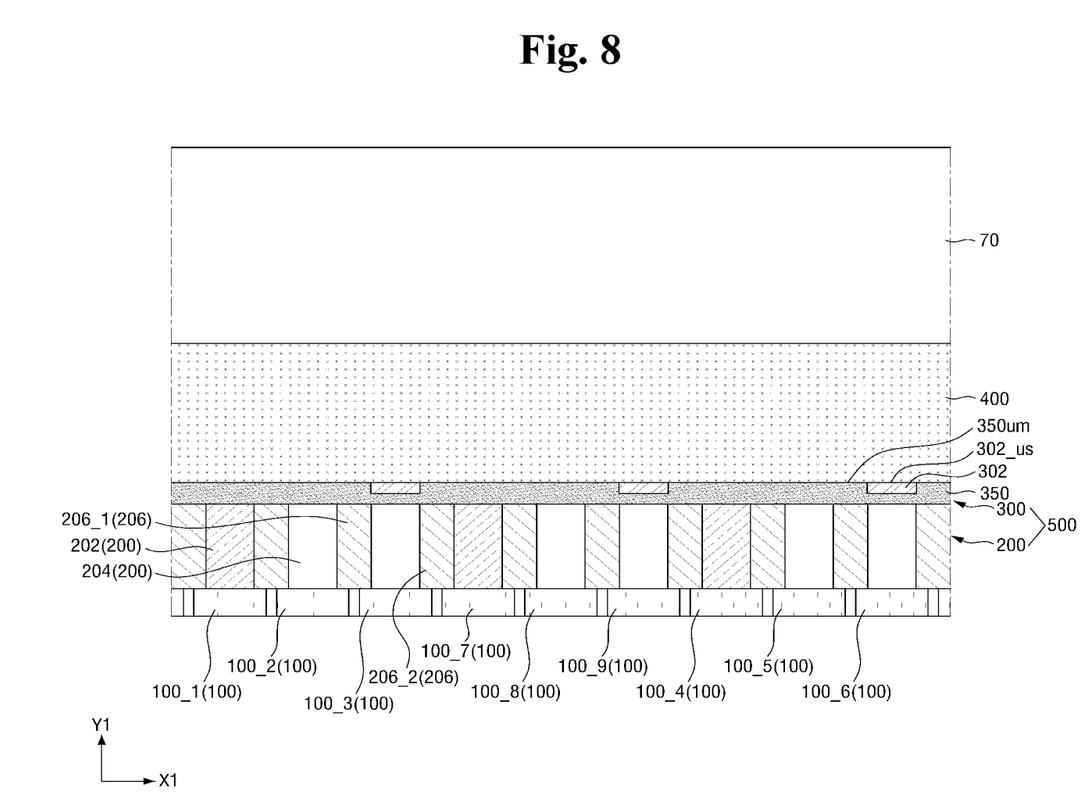

Referring to FIG. 8, the second oxide film 350, the buffer layer 400, and the substrate 70 may be bonded onto the first light conversion layer 200. For example, fusion bonding may be used as a method for bonding the second oxide film 350, the buffer layer 400, and the substrate 70 onto the first light conversion layer 200.

In some example embodiments, the substrate 70 may be bonded with the buffer layer 400 under a processing condition of 200° C. or higher.

Referring to FIGS. 1, 7, and 8, in some example embodiments, the first height 206H1 of the partition wall 206 may be reduced by the third thickness 350TH2 of the second oxide film 350. As the first height 206H1 of the partition wall 206 decreases, the light extraction efficiency of the light-emitting element may be improved.

Figure 9:
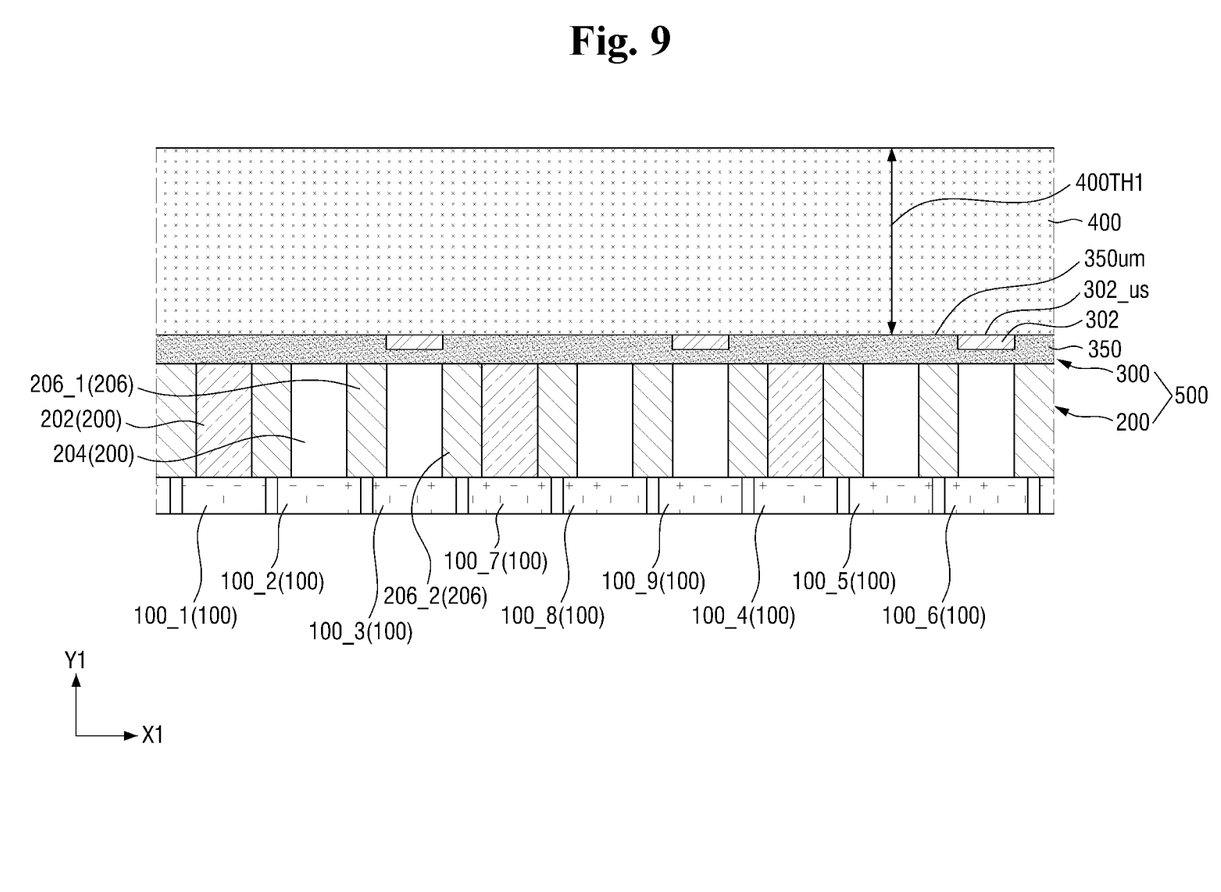

Referring to FIG. 9, the thickness of the substrate 70 may be reduced through a planarization process such as grinding or the like. Specifically, the substrate 70 may be ground so that a top surface of the substrate 70 may be flattened. In some example embodiments, a grinding process or an etching process may be performed on the substrate 70 to remove the substrate 70.

In some example embodiments, the substrate 70 may be removed by polishing, dry-etching, or a combination thereof other than the grinding. However, example embodiments are not limited thereto.

In some example embodiments, a fourth thickness 400TH1 of the buffer layer 400 may be 5 μm.

Figure 10:
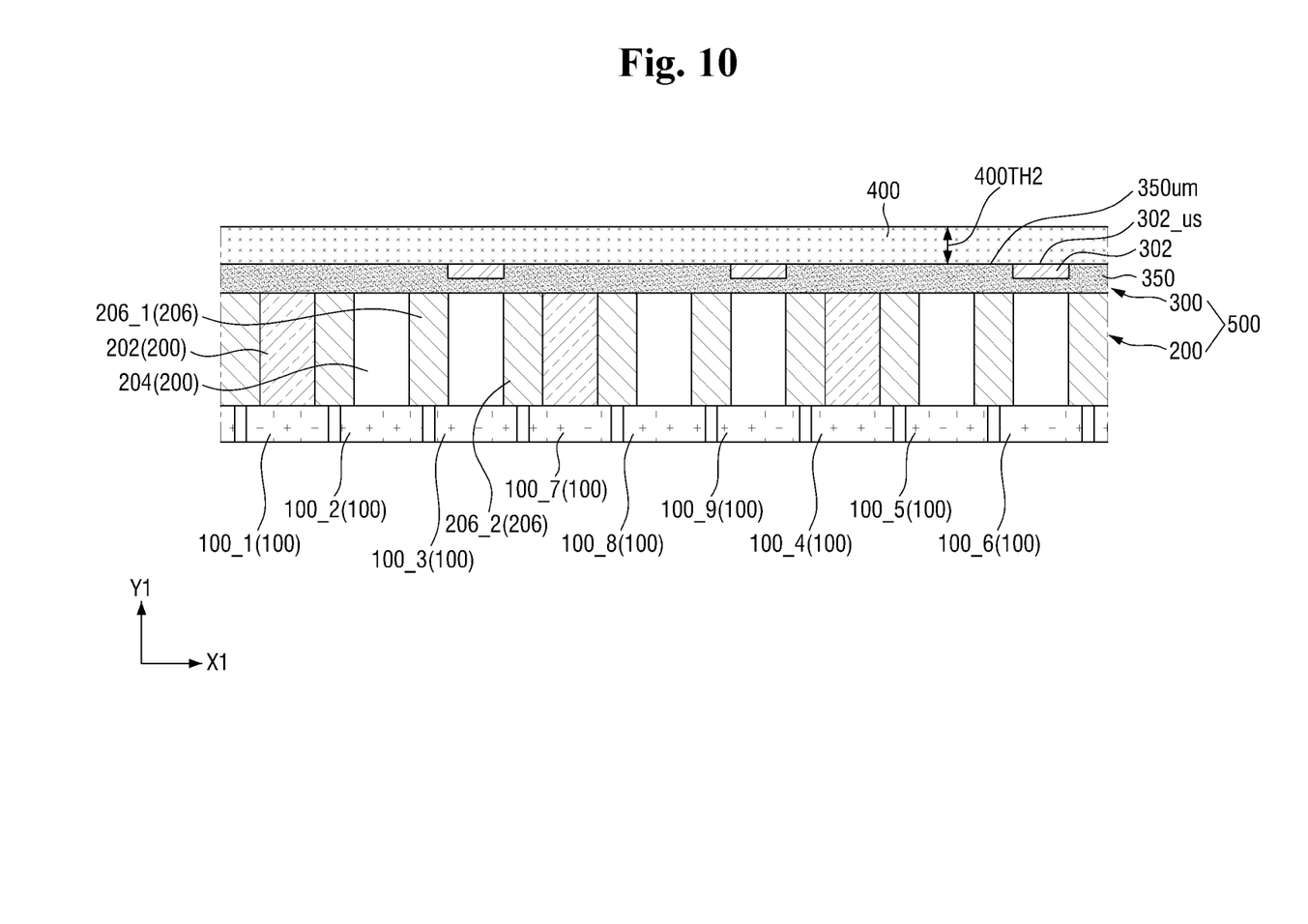

Referring to FIGS. 9 and 10, a fifth thickness 400TH2 of the buffer layer 400 may be 1 μm. Specifically, the fourth thickness 400TH1 of the buffer layer 400 may be reduced to the fifth thickness 400TH2 by performing an etching process on the buffer layer 400.

While example embodiments according have been described above with reference to the accompanying drawings, the present disclosure is not limited to the aforementioned example embodiments. For example, a light-emitting element package may be manufactured in various different forms. Those having ordinary knowledge in the technical field understand that the present disclosure may be embodied in other specific forms without departing from the technical idea and essential characteristics of the present disclosure. Therefore, it should be understood that the example embodiments described above are illustrative in all aspects and not restrictive.

What is claimed is:

1. A light-emitting element package comprising:
   a plurality of light-emitting structures spaced from each other in a first direction, the plurality of light-emitting structures comprising a first light-emitting structure, a second light-emitting structure and a third light-emitting structure, each of the plurality of light-emitting structures being configured to emit light of a first color;
   a first wavelength conversion layer provided on the first light-emitting structure at a first position corresponding to the first light-emitting structure, the first wavelength conversion layer being configured to convert light of the first color into light of a second color;
   partition walls spaced apart from the first wavelength conversion layer in the first direction;
   a first oxide film provided on the first wavelength conversion layer; and
   a second wavelength conversion layer disposed in the first oxide film at a second position corresponding to the second light-emitting structure, the second wavelength conversion layer being configured to convert light of the first color into light of a third color,
   wherein the first wavelength conversion layer and the second wavelength conversion layer have different structures, and wherein the partition walls do not overlap the second wavelength conversion layer along the first direction.

2. The light-emitting element package of claim 1, wherein the first wavelength conversion layer comprises a quantum dot structure, and
wherein the second wavelength conversion layer comprises a quantum well structure.

3. The light-emitting element package of claim 1, wherein the first wavelength conversion layer does not overlap the second wavelength conversion layer along a second direction that crosses the first direction.

4. The light-emitting element package of claim 1, wherein the first wavelength conversion layer is interposed between two of the partition walls.

5. The light-emitting element package of claim 1, further comprising a first transmission layer spaced apart from the first wavelength conversion layer and the partition walls in the first direction.

6. The light-emitting element package of claim 1, wherein a top surface of the second wavelength conversion layer is substantially coplanar with a top surface of the first oxide film.

7. The light-emitting element package of claim 1, further comprising:
a plurality of electrodes respectively corresponding to the plurality of light-emitting structures; and
a first light conversion layer comprising the first wavelength conversion layer,
wherein the plurality of light-emitting structures are interposed between the plurality of electrodes and the first light conversion layer, and
wherein each of the plurality of electrodes includes electrode layers.

8. The light-emitting element package of claim 7, further comprising a second oxide film filled between the plurality of electrodes.

9. The light-emitting element package of claim 7, further comprising a buffer layer disposed on the first oxide film,
wherein the first oxide film is interposed between the buffer layer and the first light conversion layer.

10. The light-emitting element package of claim 1, wherein the second wavelength conversion layer comprises a GaN-based material.

11. The light-emitting element package of claim 1, wherein the first oxide film is provided between the second wavelength conversion layer and the plurality of light-emitting structures.

12. A light-emitting element package comprising:
a plurality of light-emitting structures spaced from each other in a first direction, the plurality of light-emitting structures comprising a first light-emitting structure, a second light-emitting structure and a third light-emitting structure, each of the plurality of light-emitting structures being configured to emit light of a first color;
a light conversion layer disposed on the plurality of light-emitting structures, the light conversion layer comprising a first wavelength conversion layer disposed at a first location corresponding to the first light-emitting structure and a second wavelength conversion layer disposed at a second location corresponding to the second light-emitting structure; and
partition walls that are spaced apart from the first wavelength conversion layer in the first direction and do not overlap the second wavelength conversion layer along the first direction,
wherein the first wavelength conversion layer comprises a quantum dot and is configured to convert light of the first color into light of a second color, and
wherein the second wavelength conversion layer comprises a quantum well and is configured to convert light of the first color into light of a third color.

13. The light-emitting element package of claim 12, wherein the quantum dot does not overlap the quantum well along a second direction that crosses the first direction.

14. The light-emitting element package of claim 12, wherein the quantum dot is interposed between two of the partition walls.

15. The light-emitting element package of claim 14, wherein the partition walls comprise a metal.

16. The light-emitting element package of claim 12, wherein the quantum well comprises a GaN-based material.

17. A light-emitting element package comprising:
a plurality of electrodes disposed in a first oxide film;
a plurality of light-emitting structures disposed on the first oxide film, the plurality of light-emitting structures being spaced from each other in a first direction, emitting light of a first color, and comprising a first light-emitting structure, a second light-emitting structure and a third light-emitting structure;
a first light conversion layer disposed on the plurality of light-emitting structures, the first light conversion layer comprising a quantum dot at a first position corresponding to the first light-emitting structure and partition walls; and
a second light conversion layer disposed on the first light conversion layer, the second light conversion layer comprising a second oxide film and a quantum well at a second position corresponding to the second light-emitting structure,
wherein the partition walls do not overlap the second light conversion layer along the first direction,
wherein the quantum dot is configured to convert light of the first color into light of a second color,
wherein the quantum well is configured to convert light of the first color into light of a third color,
wherein the quantum dot is interposed between two of the partition walls, and
wherein the quantum dot and the quantum well do not overlap each other in a second direction that crosses the first direction.

18. The light-emitting element package of claim 17, further comprising a buffer layer disposed on the second light conversion layer,
wherein the second light conversion layer is interposed between the buffer layer and the first light conversion layer.

19. The light-emitting element package of claim 17, wherein the quantum well comprises a GaN-based material.

20. The light-emitting element package of claim 17, wherein a top surface of the quantum well is substantially coplanar with a top surface of the second oxide film.

* * * * *